United States Patent
Croix et al.

(10) Patent No.: US 7,444,604 B2
(45) Date of Patent: Oct. 28, 2008

(54) APPARATUS AND METHODS FOR SIMULATION OF ELECTRONIC CIRCUITRY

(75) Inventors: John F. Croix, Austin, TX (US); Curtis Ratzlaff, Austin, TX (US)

(73) Assignee: Nascentric, Inc., Austin, TX (US)

( * ) Notice: Subject to any disclaimer, the term of this patent is extended or adjusted under 35 U.S.C. 154(b) by 515 days.

(21) Appl. No.: 10/947,824

(22) Filed: Sep. 23, 2004

(65) Prior Publication Data

US 2005/0076318 A1  Apr. 7, 2005

Related U.S. Application Data

(60) Provisional application No. 60/506,701, filed on Sep. 26, 2003.

(51) Int. Cl.
*G06F 17/50* (2006.01)

(52) U.S. Cl. .................. 716/4; 716/5; 716/6; 703/14

(58) Field of Classification Search .................. 716/4–6; 703/14
See application file for complete search history.

(56) References Cited

U.S. PATENT DOCUMENTS

| | | | | |
|---|---|---|---|---|
| 5,313,398 | A * | 5/1994 | Rohrer et al. .................. | 703/14 |
| 5,373,457 | A | 12/1994 | George et al. | |
| 5,379,231 | A * | 1/1995 | Pillage et al. .................. | 703/14 |
| 5,692,158 | A * | 11/1997 | Degeneff et al. ................ | 703/2 |
| 5,857,164 | A | 1/1999 | Wakita | |
| 6,349,272 | B1 * | 2/2002 | Phillips .......................... | 703/2 |
| 6,530,065 | B1 * | 3/2003 | McDonald et al. ............. | 716/4 |
| 6,789,237 | B1 | 9/2004 | Ismail | |
| 7,013,440 | B2 * | 3/2006 | Croix ............................. | 716/4 |
| 7,035,782 | B2 * | 4/2006 | Yang et al. ..................... | 703/14 |
| 7,065,720 | B2 * | 6/2006 | Croix ............................. | 716/1 |
| 7,127,384 | B2 * | 10/2006 | Zolotov et al. ................. | 703/14 |
| 7,191,414 | B1 * | 3/2007 | Croix ............................. | 716/4 |
| 7,194,716 | B2 * | 3/2007 | Croix ............................. | 716/6 |
| 2003/0149962 | A1 * | 8/2003 | Willis et al. .................. | 717/135 |

OTHER PUBLICATIONS

Fu et al; "An effective method to reduce the computing time of nonlinear time-stepping finite-element magnetic field computation"; Magnetics, IEEE Transactions on vol. 38, Issue 2, Part 1, Mar. 2002 pp. 441-444.*

Chen, "Path Sensitization In Critical Path Problem", IEEE Transactions On Computer Aided Design Of Integrated Circuits And Systems, vol. 12, No. 2, Feb. 1993, pp. 196-207.

(Continued)

*Primary Examiner*—Jack Chiang
*Assistant Examiner*—Naum B Levin
(74) *Attorney, Agent, or Firm*—Lawrence J. Merkel; Meyertons, Hood, Kivlin, Kowert & Goetzel, P.C.

(57) ABSTRACT

A system for analyzing a model of an electronic circuit, which includes at least one non-linear circuit element, includes a computer. The computer replaces the non-linear circuit element with a linearized circuit model that approximates a behavior of the non-linear circuit element. The computer also inserts into an element matrix a calculated value that corresponds to the linearized circuit model for a prescribed or desired time step. The computer further performs a numerical operation on the element matrix to effectively invert the element matrix.

24 Claims, 6 Drawing Sheets

OTHER PUBLICATIONS

Dartu et al., "TETA: Transistor-Level Engine For Timing Analysis", 35th Design Automation Conference, 1998, 4 pgs.

Croix et al., "A Fast And Accurate Technique To Optimize Characterization Tables For Logic Synthesis", 34th Design Automation Conference, 1997, 4 pgs.

Dartu et al., "Calculating Worst-Case Gate Delays Due To Dominant Capacitance Coupling", 34th Design Automation Conference, 1997, 6 pgs.

Lam et al., "Exact Minimum Cycle Times For Finite State Machines", Proceedings Of The 31st IEEE/ACM Design Automation Conference, Jun. 1994, 6 pgs.

O'Brien et al., "Modeling The Driving-Point Characteristic Of Resistive Interconnect For Accurate Delay Estimation", IEEE, 1989, pp. 512-515.

Pillage et al., "Asymptotic Waveform Evaluation For Timing Analysis", IEEE Transactions On Computer Aided Design, vol. 9, No. 4, Apr. 1990, pp. 352-366.

Qian et al., "Modeling The "Effective Capacitance" For The RC Interconnect Of CMOS Gates", IEEE Transactions On Computer Aided Design Of Integrated Circuits And Systems, vol. 13, No. 12, Dec. 1994, pp. 1526-1535.

Ratzlaff et al., "RICE: Rapid Interconnect Circuit Evaluation Using AWE", IEEE Transactions On Computer Aided Design Of Integrated Circuits And Systems, vol. 13, No. 6, Jun. 1994, pp. 763-776.

Silveira et al., "Efficient Reduced-Order Modeling Of Frequency-Dependent Coupling Inductances Associated With 3-D Interconnect Structures", 32nd ACM/IEEE Design Automation Conference, 1995, 5 pgs.

Dartu et al., "A Gate-Delay Model For High-Speed CMOS Circuits", 31st ACM/IEEE Design Automation Conference, 1994, 5 pgs.

McDonald et al., "Computing Logic-Stage Delays Using Circuit Simulation And Symbolic Elmore Analysis", 38th ACM Design Automation Conference, 2001, pp. 283-288.

Sun et al., "Efficient Timing Analysis For CMOS Circuits Considering Data Dependent Delays", IEEE Transactions On Computer Aided Design Of Integrated Circuits And Systems, vol. 17, No. 6, Jun. 1998, pp. 546-552.

Dartu et al., "Performance Computation For Precharacterized CMOS Gates With RC Loads", IEEE Transactions On Computer Aided Design Of Integrated Circuits And Systems, vol. 15, No. 5, May 1996, pp. 544-553.

Chen et al., "A New Gate Delay Model For Simultaneous Switching And Its Applications", 38th ACM Design Automation Conference, 2001, pp. 289-294.

Arunachalam et al., "CMOS Gate Delay Models For General RLC Loading", IEEE International Conference On Computer Design, VLSI In Computers And Processors, 1997, 6 pgs.

Yalcin et al, "Fast And Accurate Timing Characterization Using Functional Information", IEEE Transactions On Computer Aided Design Of Integrated Circuits And Systems, vol. 20, No. 2, Feb. 2001, pp. 315-331.

Shih et al., "Illiads: A Fast Timing And Reliability Simulator For Digital MOS Circuits", IEEE Transactions On Computer Aided Design Of Integrated Circuits And Systems, vol. 12, No. 9, Sep. 1993, pp. 1387-1402.

Ngoya et al., "Newton-Raphson Iteration Speed-Up Algorithm For The Solution Of Nonlinear Circuit Equations In General-Purpose CAD Programs", IEEE Transactions On Computer Aided Design Of Integrated Circuits And Systems, vol. 16, No. 6, Jun. 1997, pp. 638-644.

Acar et al., "TETA: Transistor-Level Waveform Evaluation For Timing Analysis", IEEE Transactions On Computer Aided Design Of Integrated Circuits And Systems, vol. 21, No. 5, May 2002, pp. 605-616.

Devgan et al., "Adaptively Controlled Explicit Simulation", IEEE Transactions On Computer Aided Design Of Integrated Circuits And Systems, vol. 13, No. 6, Jun. 1994, pp. 746-762.

Liu et al., "Ftd: An Exact Frequency To Time Domain Conversion For Reduced Order RLC Interconnect Models", 35th Design Automation Conference, 1998, 4 pgs.

Bracken et al., Interconnect Simulation With Asymptotic Waveform Evaluation (AWE), IEEE Transactions On Circuits And Systems-1: Fundamental Theory And Applications, vol. 39, No. 11, Nov. 1992, pp. 869-878.

Odabasioglu et al., "PRIMA: Passive Reduced-Order Interconnect Macromodeling Algorithm", IEEE, 1997, 8 pgs.

Alpert et al., "RC Delay Metrics For Performance Optimization", IEEE Transactions On Computer Aided Design Of Integrated Circuits And Systems, vol. 20, No. 5, May 2001, pp. 571-582.

Ratzlaff et al., "Modeling The RC-Interconnect Effects In A Hierarchical Timing Analyzer", IEEE Custom Integrated Circuits Conference, 1992, 4 pgs.

Raghavan et al., "A New Nonlinear Driver Model For Interconnect Analysis", 28th ACM/IEEE Design Automation Conference, 1991, pp. 561-566.

Kashyap et al., "An "Effective" Capacitance Based Delay Metric For RC Interconnect", IEEE, 2000, pp. 229-234.

Kahng et al., "An Analytical Delay Model For RLC Interconnects", IEEE Transactions On Computer Aided Design Of Integrated Circuits And Systems, vol. 16, No. 12, Dec. 1997, pp. 1507-1514.

Kam et al., "EDA Challenges Facing Future Microprocessor Design", IEEE Transactions On Computer Aided Design Of Integrated Circuits And Systems, vol. 19, No. 12, Dec. 2000, pp. 1498-1506.

Hitchcock et al., "Timing Analysis Of Computer Hardware", IBM J. Res. Develop., vol. 26, No. 1, Jan. 1982, pp. 100-105.

Darringer et al, "EDA In IBM: Past, Present, And Future", IEEE Transactions On Computer Aided Design Of Integrated Circuits And Systems, vol. 19, No. 12, Dec. 2000, pp. 1476-1497.

Kobayashi et al., "Delay Abstraction In Combinational Logic Circuits", IEEE Transactions On Computer Aided Design Of Integrated Circuits And Systems, vol. 16, No. 10, Oct. 1997, pp. 1205-1212.

Chatzigeorgiou et al., "A Modeling Technique For CMOS Gates", IEEE Transactions On Computer Aided Design Of Integrated Circuits And Systems, vol. 18, No. 5, May 1999, pp. 557-575.

Hirata et al., "Proposal Of A Timing Model For CMOS Logic Gates Driving A CRC π Load", ACM Conference, 1998, pp. 537-544.

Jen et al., "A Compact And Unified MOS DC Current Model With Highly Continuous Conductances For Low-Voltage IC's", IEEE Transactions On Computer Aided Design Of Integrated Circuits And Systems, vol. 17, No. 2, Feb. 1998, pp. 169-172.

Hafed et al., "Delay And Current Estimation In A CMOS Inverter With An RC Load", IEEE Transactions On Computer Aided Design Of Integrated Circuits And Systems, vol. 20, No. 1, Jan. 2001, pp. 80-89.

Korshak et al., "An Effective Current Source Cell Model For VDSM Delay Calculation", IEEE, 2001, pp. 296-300.

Keller et al., "A Robust Cell-Level Crosstalk Delay Change Analysis", ACM/IEEE International Workshop On Timing Issues In The Specification And Synthesis Of Digital Systems, Feb. 2004, 9 pgs.

Rubinstein et al., "Signal Delay In RC Tree Networks", IEEE Transactions On CAD, vol. 2, No. 3, 1983, pp. 202-211.

Cormen et al., "Introduction To Algorithms", McGraw-Hill, Inc., 1990, pp. 762-765.

Press et al., "Numerical Recipes In C: The Art Of Scientific Computing", Cambridge University Press, Second Edition, 1993, pp. 104-110.

McCalla, "Fundamentals Of Computer-Aided Circuit Simulation", Kluwer Academic Publishers, 1988, pp. 107-112.

Kong et al., "Digital Timing Macromodeling For VLSI Design Verification", Kluwer Academic Publishers, 1995, pp. 1-8.

Croix et al., "Blade And Razor: Cell And Interconnect Delay Analysis Using Current-Based Models", Design Automation Conference, Jun. 2003, 4 pgs.

Elmore, "The Transient Response Of Damped Linear Networks With Particular Regard To Wideband Amplifiers", Journal Of Applied Physics, vol. 19, Jan. 1948, pp. 55-63.

Matson et al., "Macromodeling And Optimization Of Digital MOS VLSI Circuits", IEEE Transactions On Computer-Aided Design, vol. CAD-5, No. 4, Oct. 1986, pp. 659-678.

Monachino, "Design Verification System For Large-Scale LSI Designs", IEEE 19th Design Automation Conference, 1982, pp. 83-90.

Synopsys, Inc., Library Compiler Reference Manual, vol. 2, Rev. 3.3b, Appendix D, 1999, pp. 1-102.

Ousterhout, "A Switch-Level Timing Verifier For Digital MOS VLSI", IEEE Transactions On Computer-Aided Design, vol. CAD-4, No. 3, Jul. 1985, pp. 336-349.

Chawla et al., "MOTIS-An MOS Timing Simulator", IEEE Transactions On Circuits And Systems, vol. CAS-22, No. 12, Dec. 1975, pp. 901-910.

Ho et al, "The Modified Nodal Approach To Network Analysis", IEEE Transactions On Circuits And Systems, vol. CAS-22, No. 6, Jun. 1975, pp. 504-509.

Kundert, "Sparse Matrix Techniques", Circuit Analysis, Simulation And Design, Advances In CAD For VLSI, vol. 3, Part 1, 1986, 45 pgs.

Maron, "Methods For Finding Roots of f(x)", Numerical Analysis: A Practical Approach, Sec. 2.2, 1982, pp. 53-57.

Horowitz et al., "Dynamic Programming", Fundamentals Of Computer Algorithms, 1978, pp. 198-203.

Pillage et al., "Electronic Circuit And System Simulation Methods", Linear Transient Analysis, 1995, 41 pgs.

\* cited by examiner

_US 7,444,604 B2_

APPARATUS AND METHODS FOR SIMULATION OF ELECTRONIC CIRCUITRY

CROSS-REFERENCE TO RELATED APPLICATIONS

This patent application claims priority to, and incorporates by reference, Provisional U.S. Patent Application Ser. No. 60/506,701, titled "Apparatus and Methods for Simulation of Electronic Circuitry," and filed on Sep. 26, 2003.

TECHNICAL FIELD

The inventive concepts relate generally to simulation of electronic circuitry and, more particularly, to providing apparatus and methods for relatively fast and accurate simulation of electronic circuitry, for example, cells in integrated circuits (ICs).

BACKGROUND

The increasing complexity of electronic circuits places demands on the design engineers to reduce the length of the design cycles and to design circuits in an efficient manner. Vendors seek to reduce the number of revisions and to increase the reliability of the design so as to increase yield and reduce costs. To address those issues, designers and vendors typically use simulation tools to model the behavior of electronic circuitry and using those models to shorten the design cycle.

Although a number of conventional tools exist for aiding designers to address the above problems, they suffer from various shortcomings. For example, designers have conventionally used Simulation Program with Integrated Circuit Emphasis (SPICE) to simulate electrical circuits. As the complexity of the designs has increased, however, the relatively low speeds with which SPICE and its variants can simulate circuits has become prohibitive. A need therefore exists for simulation tools that can help circuit designers to better meet the challenges facing them in today's markets while maintaining relatively high accuracy (e.g., the accuracy that SPICE delivers).

SUMMARY

The inventive concepts contemplate apparatus and methods for analyzing electronic circuitry. One aspect of the invention relates to apparatus for analyzing electronic circuits. In one embodiment, a system for analyzing a model of an electronic circuit, which includes at least one non-linear circuit element, includes a computer. The computer replaces the non-linear circuit element with a linearized circuit model that approximates a behavior of the non-linear circuit element. The computer also inserts into an element matrix a calculated value that corresponds to the linearized circuit model for a prescribed or desired time step. The computer further performs a numerical operation on the element matrix to effectively invert the element matrix.

Another aspect of the invention relates to computer program products that include a computer application adapted for processing by a computer to analyze a model of an electronic circuit that includes at least one non-linear circuit element. In one embodiment, the computer application causes the computer to (a) model that approximates a behavior of the at least one non-linear circuit element, (b) insert into an element matrix a calculated value corresponding to the linearized circuit model for a time step, and (c) perform a numerical operation on the element matrix to effectively invert the element matrix.

Yet another aspect of the invention relates to methods of analyzing electronic circuits. In one embodiment, a method of analyzing a model of an electronic circuit that includes at least one non-linear circuit element includes replacing the at least one non-linear circuit element with a linearized circuit model that approximates a behavior of the at least one non-linear circuit element. The method further includes inserting into an element matrix a calculated value corresponding to the linearized circuit model for a time step, and performing a numerical operation on the element matrix to effectively invert the element matrix.

BRIEF DESCRIPTION OF THE DRAWINGS

The appended drawings illustrate only exemplary embodiments of the invention and therefore should not be considered as limiting its scope. Persons of ordinary skill in the art who have the benefit of this description appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

This invention contemplates apparatus and associated methods for simulation of electronic circuitry. Models and simulation tools according to the invention enable near-SPICE accurate analysis of electrical and electronic circuitry and components at speeds hundreds or thousands of times faster than SPICE.

The electrical analysis consists of determining voltage waveforms at specific or desired nodes in a circuit netlist, and current flows through elements or components in that netlist. This fundamental information can then be used to calculate timing and power information about the entity (e.g., circuit, cell) being analyzed.

Figure 1:
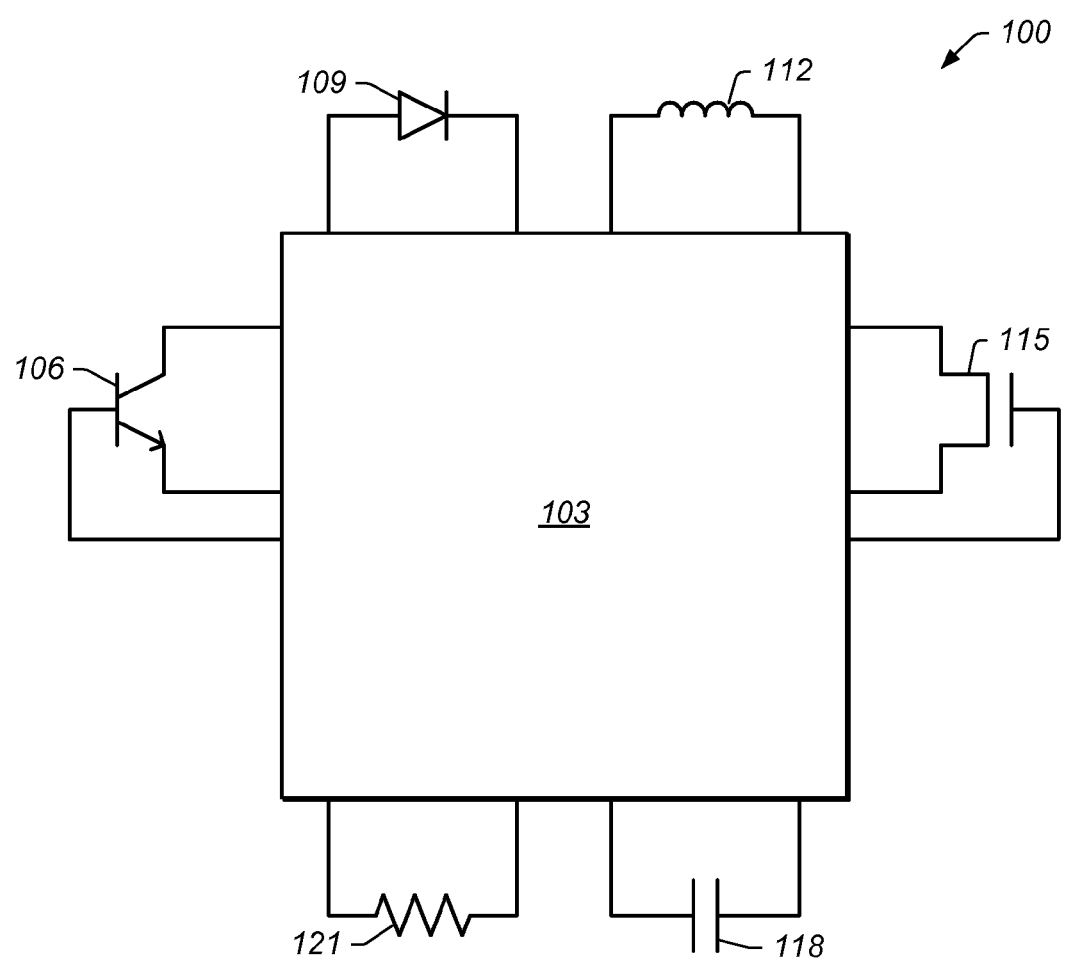
FIG. 1 shows a conceptual block diagram of an electronic circuit (for example, a cell in an IC) for modeling with an exemplary embodiment according to the invention.

In digital logic design, netlists used for electrical analysis typically contain some combination of resistors, capacitors, inductors, transistors, diodes, and/or other electrical components or elements. FIG. 1 shows a conceptual block diagram of an electronic circuit 100 (for example, a cell in an IC) for modeling with an exemplary embodiment according to the invention.

Circuit 100 may generally include a variety of types and numbers of electronic components. More specifically, the circuit may include a combination of one or more linear and non-linear components or elements. In the representative example shown, circuit 100 includes both linear and non-linear elements.

In addition, circuit 100 includes interconnect network 103. Interconnect network 103 represents the coupling mechanisms that electrically couple the various electronic elements together (e.g., conductor or semiconductor traces in an IC, and the like). Generally, interconnect network 103 may have any desired form and governs the topology of circuit 100.

The linear elements include a combination of one or more resistors 121, one or more capacitors 118, and one or more inductors 112. The non-linear elements include a combination of one or more bipolar junction transistors (BJTs) 106, one or more diodes 109, and one or more metal oxide semiconductor field-effect transistors (MOSFETs) 115.

Persons of ordinary skill in the art who have the benefit of this description, however, understand that in addition or instead of the components shown, one may include other electronic elements in circuit 100, as desired. For example, the linear elements may include mutual inductors (not shown explicitly), as desired. As another example, the non-linear elements may include non-linear capacitors (not shown explicitly), as desired.

Linear elements (e.g., resistors, capacitors, and inductors) can be analyzed in a relatively straight-forward manner in a variety of ways, for example, as done in SPICE or its variants. Because of their linear nature, models for linear elements tend to be relatively simple and straightforward.

Non-elements, such as transistors and diodes (along with some special forms of non-linear resistors, capacitors, and inductors), however, may behave in a different fashion. Consequently, they may require extra processing. In other words, their electrical behavior is a function of their current state (which itself may be a function of their previous state(s)), and several different equations may be used to predict or model their behavior depending on the state that they are in at a particular time. Thus, during electrical analysis, equations for these non-linear elements are constantly and repeatedly evaluated to determine their state while the simulation tool (e.g., SPICE) attempts to converge upon a solution for their state at any single point in time.

Upon evaluating the equations governing the behavior of the non-linear elements, the values associated with those equations (along with values for the linear elements) are "stamped" into a numerical matrix (i.e., populating the matrix, or inserting, stenciling, or placing into the matrix the values or entities, as persons of ordinary skill in the art who have the benefit of this description understand). This process occurs for every element in the circuit's netlist.

Once the entire matrix has been "stamped," the matrix (or a companion or derivative matrix or a matrix related to or derived from the circuit or system, such as the Jacobian) is inverted so as to solve the linear algebra problem entailed in the simulation and analysis of the circuit. Note that, as persons of ordinary skill in the art who have the benefit of this description understand, rather than using matrix inversion, one may apply other equivalent numerical techniques, as desired.

Without limiting the inventive concepts, and merely as one illustrative example, consider the simple linear algebra formulation of:

$$Ax=b,$$

where A is the stamped matrix, x is a vector of values to solve for, and b is a vector of known values. Persons of ordinary skill in the art who have the benefit of this description understand that the above equation provides an example and is not meant to limit the inventive concepts or the simulation methods and apparatus to equations having the above form. For example, one may partition the A matrix for various topologies or element types or use equivalents of it, as desired.

To solve for x, as noted above, various numerical algorithms may be applied, including the inversion of matrix A. The solution to this problem, however, is relatively time consuming and dependent upon the size of matrix A. This simple process of evaluating non-linear elements, stamping all entries into the matrix A, and then solving the equation by numerically manipulating the matrix A occurs at each time point in a transient analysis during SPICE simulation.

This is a very time consuming set of operations. Further complicating the situation is that the time-step being used during transient analysis may be one of the parameters used to evaluate both the linear and non-linear equations. Thus, if SPICE cannot converge to an answer or control the error of numerical integration at its current time-step (time-step it uses in one iteration), it may reduce its time-step, thus forcing a re-evaluation of the stamped matrix and increasing the overall analysis time.

Put another way, non-linear elements are governed by equations that must be evaluated and re-evaluated, potentially many times, to solve a system of equations for the circuit at a specific point in time. Once the matrix is stamped for the representative matrix (or matrices), the numerical operations (like matrix inversion) that are performed in order to solve the system of equations can be relatively complex and very time consuming. This process occurs multiple times at each time point being solved for.

Transient analysis occurs by solving for a plurality of different points in time using a time-step between those points. This time-step may vary in order to converge upon an answer, thus forcing re-evaluation of the equations. Note that the re-evaluation occurs for both linear and non-linear elements.

Figure 2:
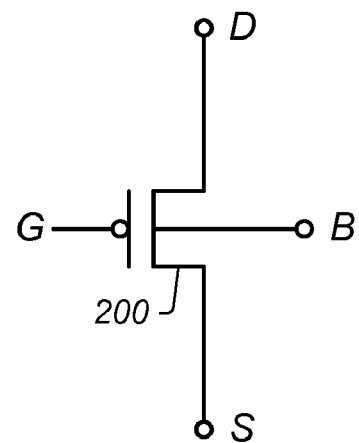
FIG. 2 illustrates an example of a non-linear element (a transistor) for modeling and analysis according to illustrative embodiments of the invention.

The inventive concepts eliminate many of the time-consuming, repetitive operations involved in the analysis of the circuit. First, non-linear elements are replaced by linear elements that approximate the non-linear behavior relatively closely. For example, a transistor may be replaced by a combination of current source(s), resistances, and capacitances. FIG. 2 shows a transistor 200, an example of a non-linear element. Note that, generally, the current sources are not linear, but are a non-linear function of the terminal voltages of the transistor with the non-linear function evaluated via a table look-up or mathematical equation. (In other words, one may use different forms or techniques to calculate the current, as desired.)

Figure 3:
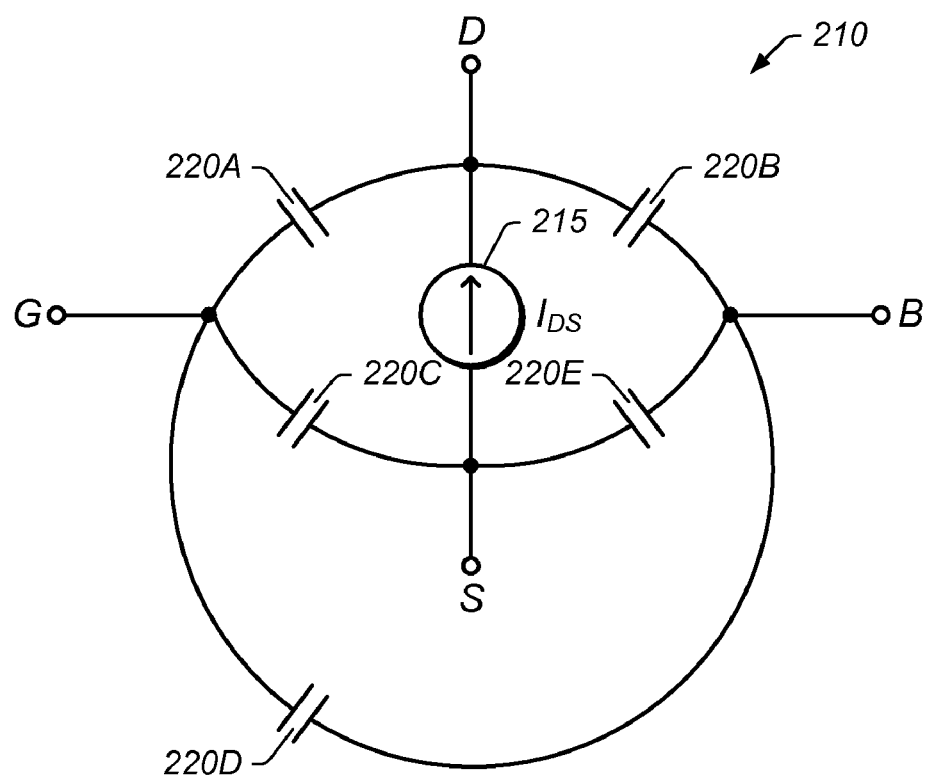
FIG. 3 depicts an equivalent model of the transistor in FIG. 2, used in circuit analysis according to exemplary embodiments of the invention.

FIG. 3 illustrates an equivalent model 210 of transistor in FIG. 2, used in circuit analysis according to exemplary embodiments of the invention. Equivalent model 210 includes current source 215, which represents the drain-source current ($I_{DS}$) of transistor 200 (obtained in exemplary embodiments by using a table lookup DC analysis of $V_G$, $V_S$, $V_B$, and $V_D$). Model 200 also includes five capacitors 220A-220E, which represent the various capacitances in transistor 200 (e.g., capacitor 220A represents the drain-to-gate capacitance, $C_{dg}$, and the like).

Note that the model in FIG. 3 includes linear replacements for the non-linear (e.g., transistor) elements. The value for these replacement linear elements may be a function of the time-step (Δt) used during transient analysis and the current through and/or voltage across that device, but are otherwise constant.

Figure 4:
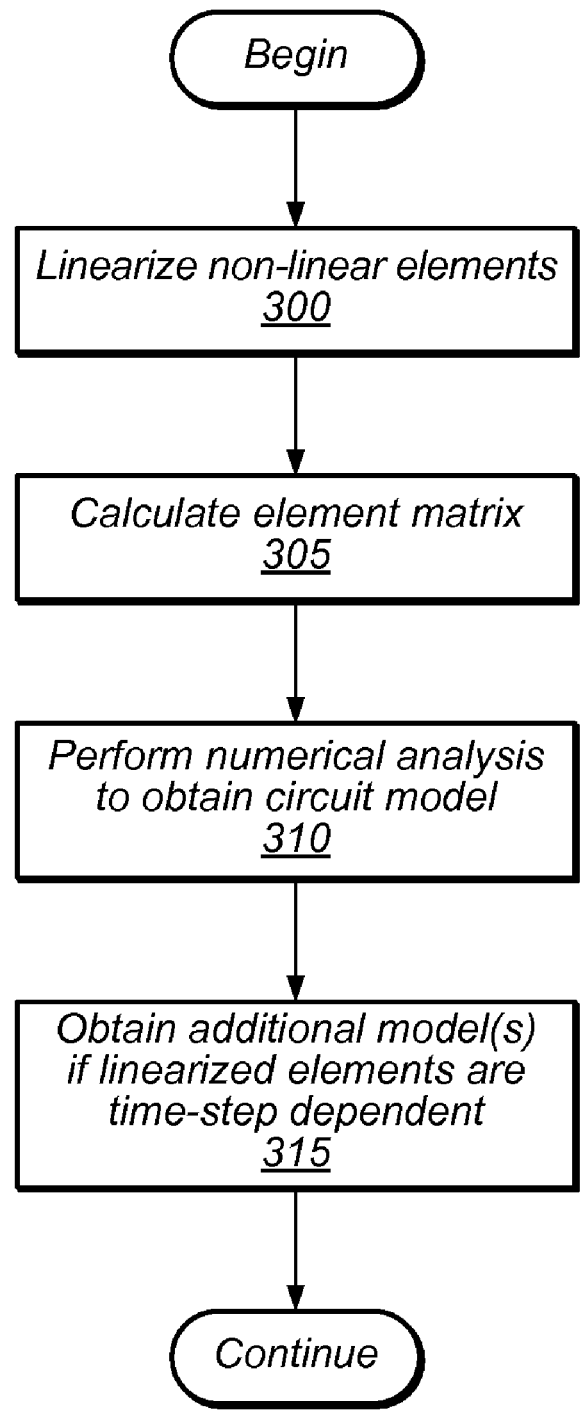
FIG. 4 shows conceptual flow-diagram for creating a simulation model of an electronic circuit according to an illustrative embodiment of the invention.

Apparatus and methods according to the invention use the following techniques to create a simulation model for a circuit. FIG. 4 shows a conceptual flow-diagram for creating a simulation model of an electronic circuit according to an illustrative embodiment of the invention. Starting with a given time-step (Δt), at 300, non-linear elements are replaced with linear models consisting of current supplies, voltage supplies, resistors, inductors, and/or capacitors, as the example above shows. At 305, for a given time-step, the values of all linearized elements are calculated. The element matrix is calculated by "stamping" it with these values.

At 310, numerical operations are then performed on this matrix to effectively invert the matrix. The operations may include matrix inversion, LU decomposition for forward and backward substitution, or some other effective equivalent, as persons of ordinary skill in the art who have the benefit of this description understand. As an example, illustrative embodiments of the invention use Cholesky factorization where the matrices are both symmetric and positive definite. The resultant matrix is stored as a model for that circuit for that specific time-step.

If the values of the linear elements are not time-step dependent, then one need not create any additional models (in other words, one may pre-compute a single matrix to be used for all time-steps). Otherwise, at 315, multiple models for different time-steps may be created (by iteration, with varying time-step values), as desired.

During analysis, most intermediate operations used conventionally are eliminated by using models according to the invention. Thus, instead of reevaluating equations (models) for non-linear elements, linearizing those elements, stamping the matrix with those elements, inverting the matrix, and solving the system of equations, in models according to the invention a non-linear solver is used iteratively to solve for the voltage/current solutions.

Figure 5:
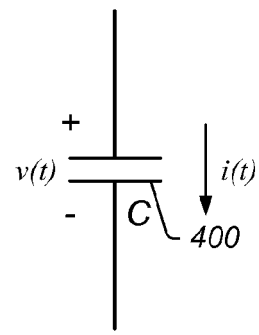
FIG. 5 illustrates a linear capacitor used to illustrate modeling according to exemplary embodiments of the invention.

As an example, consider a simple (linear) capacitor 400 shown in FIG. 5. Capacitor 400 has a capacitance C, a voltage v(t) across it, and a current i(t) flowing through it. Note that the example in FIG. 5 is illustrative only and does not limit the inventive concepts or their application, as artisans appreciate. As persons of ordinary skill in the art who have the benefit of this description understand, one may stamp a capacitor into a matrix by converting it into an equivalent current supply/resistance in parallel with one another.

Figure 6:
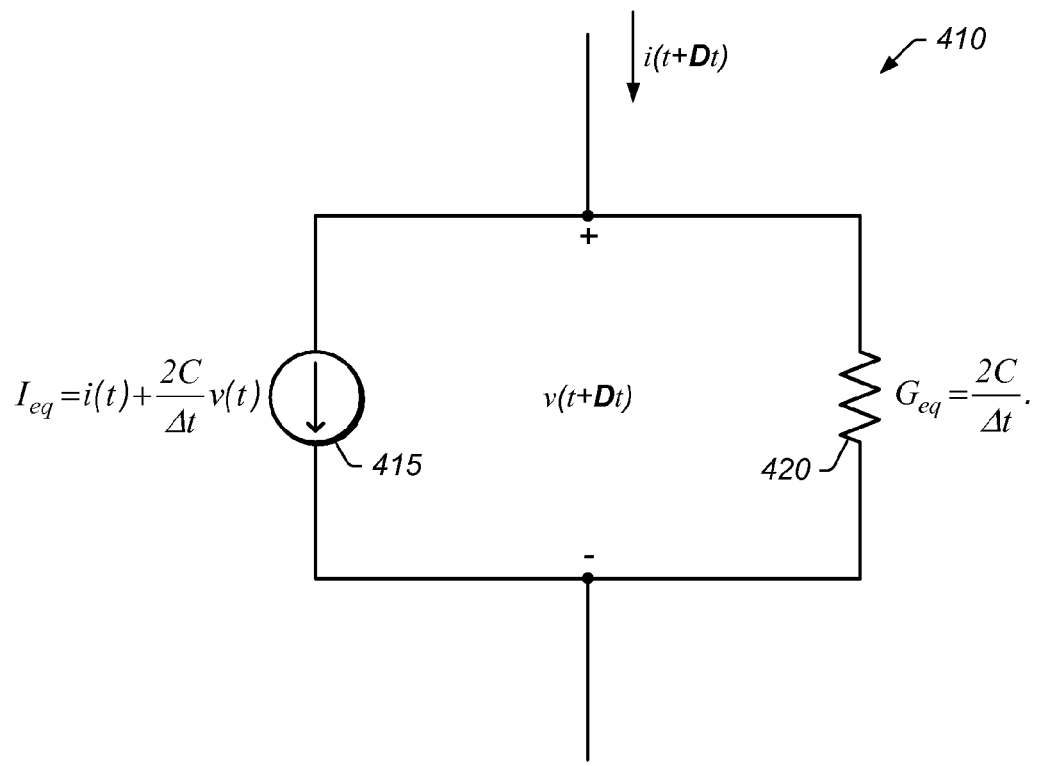
FIG. 6 depicts a model of the capacitor shown in FIG. 5 for analysis according to exemplary embodiments of the invention.

In FIG. 6, simple capacitor 400 (see FIG. 5) is replaced by its Norton equivalent companion model 410 for trapezoidal analysis. As persons of ordinary skill in the art with the benefit of the description of the application understand, however, other analysis methods may be used, as desired. The companion model consists of a current supply 415 and a resistance 420 in parallel.

The values for these elements are based on previous current and voltage values as well as the time-step (Δt) used in the analysis of the circuit that includes the capacitor. More specifically, as FIG. 6 depicts, the value of the current flowing in current supply 410 ($I_{eq}$) and the conductance value ($G_{eq}$) are, respectively:

$$I_{eq} = i(t) + \frac{2C}{\Delta t}v(t),$$

and

-continued $$G_{eq} = \frac{2C}{\Delta t}.$$

In the example above, the values for the companion models are functions of the voltage at a given time, the current at a given time, the capacitor value, and the time-step used during analysis. Once one knows the capacitance (C) and the time-step (Δt), one may compute $G_{eq}$. Thus, one may a priori pre-compute values of $G_{eq}$ (or the conductance matrix, G) for various values of Δt (and store those values or matrices, as desired). A program like SPICE, however, solves for the current and voltage at a time point. The remaining variable, the time-step, is chosen by the software application.

In models according to the invention, the values associated with this capacitor can be pre-stamped for specific time-steps. This same principle extends to multiple elements (not just capacitors), such that the entire matrix for a circuit may be pre-stamped for a given time-step. Once the matrix has been fully populated, it can be inverted, or some other equivalent numerical approach may be used, as persons skilled in the art who have the benefit of this description understand. The inverted matrix may be stored such that these operations do not need to occur during the simulation process.

The following equations summarize the above process. The process seeks to solve the equation $$Gv=i,$$

where G, v, and i represent, respectively, the conductance matrix, voltage, and current. Starting with an initial guess for the voltage value ($v_0$), one calculates the current as a function of the voltage, i.e., $i(v_0)$. Note that vector i does not necessarily always contain currents. For example, to stamp a voltage supply into the matrix, one would enter the voltage source into the i vector, 1's into the corresponding locations in matrix G, and solve for the current through the voltage source.

Figure 7:
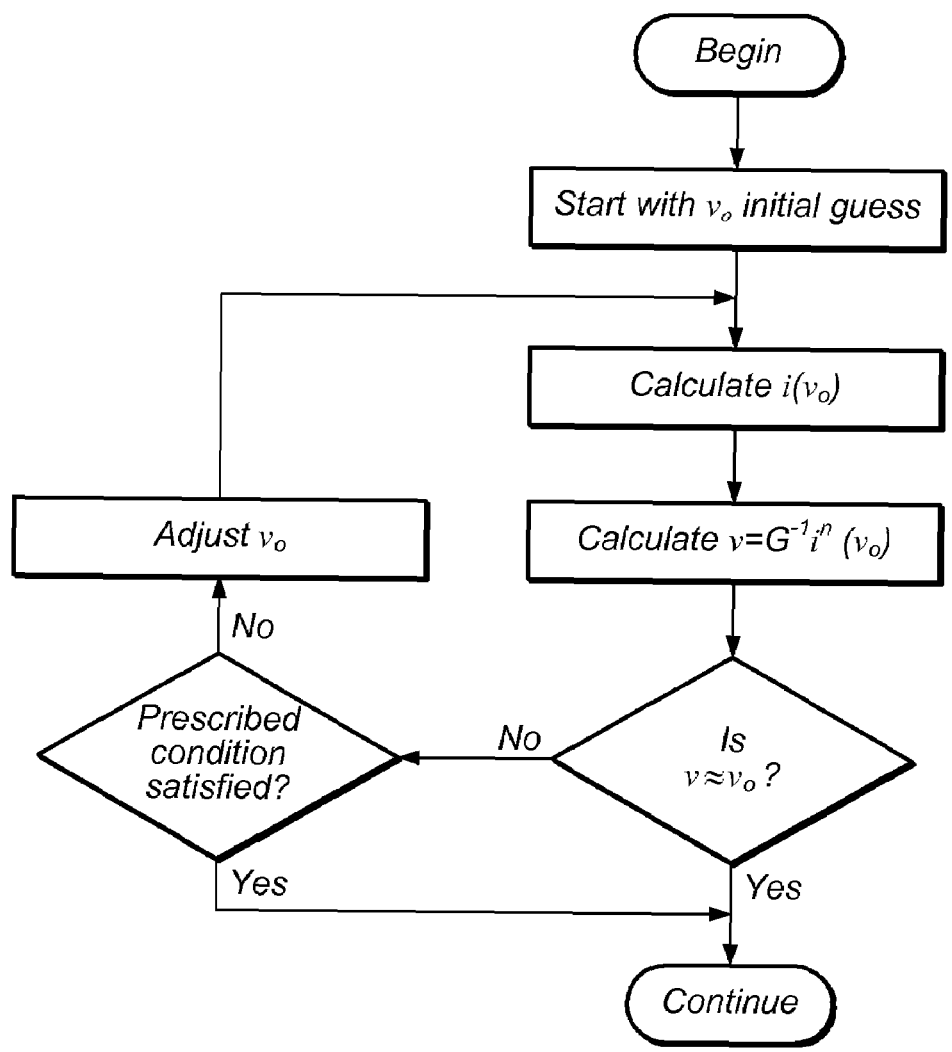
FIG. 7 shows a flow-diagram of the process steps for solving equations for analyzing a circuit according to exemplary embodiments of the invention.

One may then calculate the voltage, v, as a function of the current:

$$v = G^{-1}i(v_0),$$

or $$Gv = i(v_0),$$

where G represents the conductance matrix. The process then checks to determine whether the calculated voltage, v, approximately equals $v_0$. If so, then a solution has been found. If not, the process adjusts the value of $v_0$ and iterates the calculation of $i(v_0)$ and v until it either finds a solution or a prescribed condition occurs (e.g., it exceeds the allowed maximum number of iterations). FIG. 7 shows a conceptual flow-diagram of the process steps.

Note that the non-linear behavior associated with non-linear elements are modeled using table look-up (or even equations, as desired) on the right side of the equation above. Note further that changing the values of vector i does not cause the re-stamping or re-factoring of matrix G.

When the compilation according to the invention is performed on a circuit like a two-input NAND gate, non-linear elements like transistors and diodes would be converted into some combination of voltage supplies, current supplies, resistors, capacitors, and/or inductors. These elements may be pre-stamped into a matrix for a specific time-step, and the appropriate matrix operations performed. The resultant matrix may be stored (a matrix corresponding to a specific time-step) for later recall and use during simulation.

Note that further optimizations to the compiled models may be performed, as desired. The choice of further optimization depends on factors such as the circuit topology and companion models used, as persons of ordinary skill in the art who have the benefit of the description of the application understand.

As one optimization, one may apply circuit or node tearing. Circuit or node tearing involves the splitting of a circuit into two or more sub-circuits, analyzing them apart, and then combining their results into a composite result. This might be done for large cells or circuit blocks. The sub-circuit matrices would be pre-computed and stored, and then the solution to each sub-circuit and combination of results may be done when the model is evaluated. One may use this optimization together with the invention without any loss of generality, as persons of ordinary skill in the art who have the benefit of this description understand.

As another optimization, one may employ circuit folding or compaction. More specifically, these techniques involve a reduction in the size of the matrix (and therefore number of equations). Companion models arranged within certain circuit topologies may lend themselves to some degree of size reduction of the matrix.

Folding involves the linear combination of elements within the composite companion model of the circuit to form equivalent elements. As one example, current sources in parallel may be combined to form one equivalent current source whose current value equals the sum of the original current sources, and the like.

This technique might be implemented by changing the circuit (after including companion models) first, or by changing the matrix. The two are mathematically equivalent to each other, as persons skilled in the art who have the benefit of this description understand. One may use this optimization together with the invention without any loss of generality, as persons of ordinary skill in the art who have the benefit of this description understand.

Once created, models according to the invention can be stored (for example, in memory, hard drive, optical drive, magnetic drives, or other desired storage media) for re-use at some later point in time. Note that one may omit storing the model, as desired. It is possible to create the model prior to evaluation and use the compiled model during program execution (i.e., the model is lost or released when the program terminates). Significant gains in speed of simulation may still be realized in this mode, even though it would not be as efficient as caching or storing the resultant models according to the invention for subsequent evaluations.

Models according to the invention, as noted above, depend upon the formulation, inversion, and use of numerical matrices to get the circuit solution. Other ways of formulating the problem exist, however, that, when analyzed, still result in an equivalent numerical analysis. For instance, some cells, once reformed with their companion models, may be analyzed by a form of "path-tracing" by which the circuit graph is traced from a selected point and numerical operations performed as each companion model element is encountered.

The "tracing" may also be pre-computed much like a matrix. The result of "evaluating" the pre-computed trace is, mathematically speaking, essentially the same as the matrix solution. Each type of circuit topology may have similar variations of formulation, as persons of ordinary skill in the art who have the benefit of this description understand.

Figure 8:
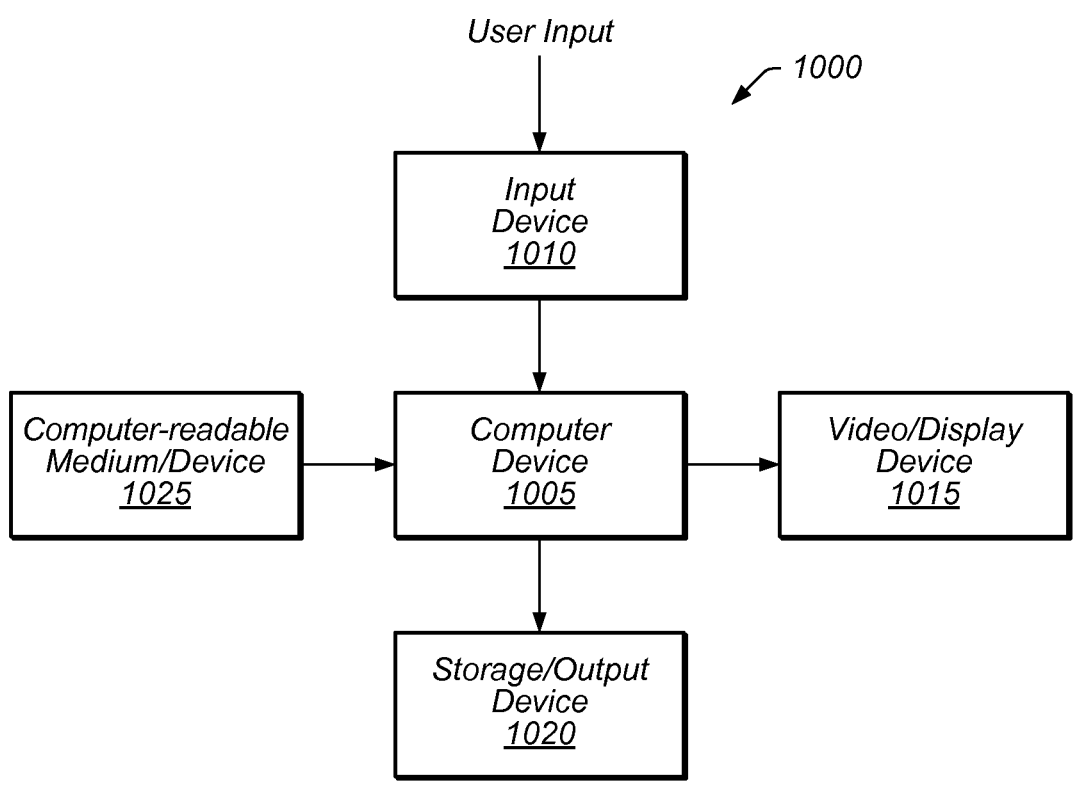
FIG. 8 illustrates a block diagram of a system for processing information (analyzing or simulating electronic circuitry) according to the invention.

To simulate a given circuit design using the inventive concepts, one typically uses a computer system that processes information relating to that circuit. FIG. 8 shows a block diagram of a system 1000 for processing information (analyzing or simulating electronic circuitry) according to the invention. System 1000 includes a computer device 1005, an input device 1010, a video/display device 1015, and a storage/output device 1020, although one may include more than one of each of those devices, as desired.

The computer device 1005 couples to the input device 1010, the video/display device 1015, and the storage/output device 1020. The system 1000 may include more that one computer device 1005, for example, a set of associated computer devices or systems, as desired.

The system 1000 operates in association with input from a user. The user input typically causes the system 1000 to perform specific desired information-processing tasks, including circuit simulation. The system 1000 in part uses the computer device 1005 to perform those tasks. The computer device 1005 includes an information-processing circuitry, such as a central-processing unit (CPU), although one may use more than one CPU or information-processing circuitry, as persons skilled in the art would understand.

The input device 1010 receives input from the user and makes that input available to the computer device 1005 for processing. The user input may include data, instructions, or both, as desired. The input device 1010 may constitute an alphanumeric input device (e.g., a keyboard), a pointing device (e.g., a mouse, roller-ball, light pen, touch-sensitive apparatus, for example, a touch-sensitive display, or tablet), or both. The user operates the alphanumeric keyboard to provide text, such as ASCII characters, to the computer device 1005. Similarly, the user operates the pointing device to provide cursor position or control information to the computer device 1005.

The video/display device 1015 displays visual images to the user. The visual images may include information about the operation of the computer device 1005, such as graphs, pictures, images, and text. The video/display device may constitute a computer monitor or display, a projection device, and the like, as persons of ordinary skill in the art would understand. If a system uses a touch-sensitive display, the display may also operate to provide user input to the computer device 1005.

The storage/output device 1020 allows the computer device 1005 to store information for additional processing or later retrieval (e.g., softcopy), to present information in various forms (e.g., hardcopy), or both. As an example, the storage/output device 1020 may constitute a magnetic, optical, or magneto-optical drive capable of storing information on a desired medium and in a desired format. As another example, the storage/output device 1020 may constitute a printer, plotter, or other output device to generate printed or plotted expressions of the information from the computer device 1005.

The computer-readable medium 1025 interrelates structurally and functionally to the computer device 1005. The computer-readable medium 1025 stores, encodes, records, and/or embodies functional descriptive material. By way of illustration, the functional descriptive material may include computer programs, computer code, computer applications, and/or information structures (e.g., data structures or file systems). When stored, encoded, recorded, and/or embodied by the computer-readable medium 1025, the functional descriptive material imparts functionality. The functional descriptive material interrelates to the computer-readable medium 1025.

Information structures within the functional descriptive material define structural and functional interrelations between the information structures and the computer-readable medium 1025 and/or other aspects of the system 1000. These interrelations permit the realization of the information structures' functionality. Moreover, within such functional descriptive material, computer programs define structural and functional interrelations between the computer programs and the computer-readable medium 1025 and other aspects of the system 1000. These interrelations permit the realization of the computer programs' functionality.

By way of illustration, the computer device 1005 reads, accesses, or copies functional descriptive material into a computer memory (not shown explicitly in the figure) of the computer device 1005. The computer device 1005 performs operations in response to the material present in the computer memory. The computer device 1005 may perform the operations of processing a computer application that causes the computer device 1005 to perform additional operations. Accordingly, the functional descriptive material exhibits a functional interrelation with the way the computer device 1005 executes processes and performs operations.

Furthermore, the computer-readable medium 1025 constitutes an apparatus from which the computer device 1005 may access computer information, programs, code, and/or applications. The computer device 1005 may process the information, programs, code, and/or applications that cause the computer device 1005 to perform additional operations.

Note that one may implement the computer-readable medium 1025 in a variety of ways, as persons of ordinary skill in the art would understand. For example, memory within the computer device 1005 may constitute a computer-readable medium 1025, as desired. Alternatively, the computer-readable medium 1025 may include a set of associated, interrelated, or networked computer-readable media, for example, when the computer device 1005 receives the functional descriptive material from a network of computer devices or information-processing systems. Note that the computer device 1005 may receive the functional descriptive material from the computer-readable medium 1025, the network, or both, as desired.

Referring to the figures, persons of ordinary skill in the art will note that the various blocks, components, and/or elements shown may depict mainly the conceptual functions and signal or process flow. The actual circuit, process step, algorithm, or system implementation may or may not contain separately identifiable hardware or software for the various functional blocks.

For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of this description understand.

Other modifications and alternative embodiments of the invention in addition to those described here will be apparent to persons of ordinary skill in the art who have the benefit of this description. Accordingly, this description teaches those skilled in the art the manner of carrying out the invention and are to be construed as illustrative only.

The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. A system for analyzing a model of an electronic circuit comprising at least one non-linear circuit element, the system comprising:
   a computer, the computer configured to:
      replace the at least one non-linear circuit element in the model with a linearized circuit model that approximates a behavior of the at least one non-linear circuit element for a timestep;
      create an element matrix corresponding to the electronic circuit;
      calculate a value corresponding to the linearized circuit model for the timestep;
      insert the calculated value into the element matrix;
      perform a numerical operation on the element matrix to effectively invert the element matrix; and
      subsequent to performing the numerical operation, perform a simulation of the electronic circuit responsive to at least one of the element matrix and the effectively inverted element matrix.

2. The system as recited in claim 1 wherein the computer is further configured to:
   determine that the linearized circuit model is timestep-dependent;
   identify a second timestep usable in the simulation;
   replace the at least one non-linear circuit element in the model with a second linearized circuit model that approximates a behavior of the at least one non-linear circuit element for the second timestep;
   create a second element matrix corresponding to the electronic circuit;
   calculate a second value corresponding to the second linearized circuit model for the second timestep;
   insert the calculated second value into the second element matrix;
   perform a numerical operation on the second element matrix to effectively invert the second element matrix; and
   wherein the computer is configured to perform the simulation subsequent to performing the numerical operation on the second element matrix.

3. The system as recited in claim 1 wherein the computer is further configured to:
   determine that the linearized circuit model is not timestep-dependent; and
   determine that no additional linearized circuit models are required for the simulation, even if the simulation uses more than one timestep.

4. The system as recited in claim 1 wherein the computer is further configured to store at least one of the element matrix and the effectively inverted element matrix to be used in a second simulation subsequent to the simulation.

5. The system as recited in claim 1 wherein the simulation is a transient simulation.

6. The system as recited in claim 5 wherein the timestep is varied during the simulation, and wherein the computer is configured, for each different timestep, to:
   replace the at least one non-linear circuit element in the model with a linearized circuit model that approximates a behavior of the at least one non-linear circuit element for the different timestep;
   create an element matrix corresponding to the electronic circuit for the different timestep;

calculate a value corresponding to the linearized circuit model for the different timestep;

insert the calculated value into the element matrix for the different timestep;

perform a numerical operation on the element matrix to effectively invert the element matrix; and wherein the computer is configured to perform the simulation subsequent to perform the numerical operation on the element matrix for each different time step.

7. The system as recited in claim 1 wherein the computer is configured to optimize the element matrix using node tearing techniques.

8. The system as recited in claim 1 wherein the computer is configured to optimize the element matrix using circuit folding techniques.

9. A computer readable storage medium storing:

a computer application adapted for processing by a computer to analyze a model of an electronic circuit comprising at least one non-linear circuit element, the computer application configured to cause the computer to:

replace the at least one non-linear circuit element in the model with a linearized circuit model that approximates a behavior of the at least one non-linear circuit element for a timestep;

create an element matrix corresponding to the electronic circuit;

calculate a value corresponding to the linearized circuit model for the timestep;

insert the calculated value into the element matrix;

perform a numerical operation on the element matrix to effectively invert the element matrix; and subsequent to performing the numerical operation, perform a simulation of the electronic circuit responsive to at least one of the element matrix and the effectively inverted element matrix.

10. The computer readable storage medium as recited in claim 9 wherein the computer application is configured to cause the computer to:

determine that the linearized circuit model is timestep-dependent;

identify a second timestep usable in the simulation;

replace the at least one non-linear circuit element in the model with a second linearized circuit model that approximates a behavior of the at least one non-linear circuit element for the second timestep;

create a second element matrix corresponding to the electronic circuit;

calculate a second value corresponding to the second linearized circuit model for the second timestep;

insert the calculated second value into the second element matrix;

perform a numerical operation on the second element matrix to effectively invert the second element matrix; and wherein the computer application is configured to cause the computer to perform the simulation subsequent to performing the numerical operation on the second element matrix.

11. The computer readable storage medium as recited in claim 9 wherein the computer application is configured to cause the computer to:

determine that the linearized circuit model is not timestep-dependent; and determine that no additional linearized circuit models are required for the simulation, even if the simulation uses more than one timestep.

12. The computer readable storage medium as recited in claim 9 wherein the computer application is configured to cause the computer to store at least one of the element matrix and the effectively inverted element matrix to be used in a second simulation subsequent to the simulation.

13. The computer readable storage medium as recited in claim 9 wherein the simulation is a transient simulation.

14. The computer readable storage medium as recited in claim 13 wherein the timestep is varied during the simulation, and wherein the computer application is configured to cause the computer, for each different timestep, to:

replace the at least one non-linear circuit element in the model with a linearized circuit model that approximates a behavior of the at least one non-linear circuit element for the different timestep;

create an element matrix corresponding to the electronic circuit for the different timestep;

calculate a value corresponding to the linearized circuit model for the different timestep;

insert the calculated value into the element matrix for the different timestep;

perform a numerical operation on the element matrix to effectively invert the element matrix; and wherein the computer application is configured to cause the computer to perform the simulation subsequent to perform the numerical operation on the element matrix for each different timestep.

15. The computer readable storage medium as recited in claim 9 wherein the computer application is configured to optimize the element matrix using node tearing techniques.

16. The computer readable storage medium as recited in claim 9 wherein the computer application is configured to optimize the element matrix using circuit folding techniques.

17. A method of analyzing a model of an electronic circuit comprising at least one non-linear circuit element, the method comprising:

replacing the at least one non-linear circuit element in the model with a linearized circuit model that approximates a behavior of the at least one non-linear circuit element for a timestep;

creating an element matrix corresponding to the electronic circuit;

calculating a value corresponding to the linearized circuit model for the timestep;

inserting the calculated value into the element matrix;

performing a numerical operation on the element matrix to effectively invert the element matrix; and subsequent to performing the numerical operation, performing a simulation of the electronic circuit responsive to at least one of the element matrix and the effectively inverted element matrix.

18. The method as recited in claim 17 further comprising:

determining that the linearized circuit model is timestep-dependent;

identifying a second timestep usable in the simulation;

replacing the at least one non-linear circuit element in the model with a second linearized circuit model that approximates a behavior of the at least one non-linear circuit element for the second timestep;

creating a second element matrix corresponding to the electronic circuit;

calculating a second value corresponding to the second linearized circuit model for the second timestep;

inserting the calculated second value into the second element matrix;

performing a numerical operation on the second element matrix to effectively invert the second element matrix; and wherein performing the simulation is subsequent to performing the numerical operation on the second element matrix.

19. The method as recited in claim 17 further comprising:
determining that the linearized circuit model is not timestep-dependent; and
determining that no additional linearized circuit models are required for the simulation, even if the simulation uses more than one timestep.

20. The method as recited in claim 17 further comprising storing at least one of the element matrix and the effectively inverted element matrix to be used in a second simulation subsequent to the simulation.

21. The method as recited in claim 17 wherein the simulation is a transient simulation.

22. The method as recited in claim 21 wherein the timestep is varied during the simulation, and wherein the method further comprises, for each different timestep:

replacing the at least one non-linear circuit element in the model with a linearized circuit model that approximates a behavior of the at least one non-linear circuit element for the different timestep;
creating an element matrix corresponding to the electronic circuit for the different timestep;
calculating a value corresponding to the linearized circuit model for the different timestep;
inserting the calculated value into the element matrix for the different timestep;
performing a numerical operation on the element matrix to effectively invert the element matrix; and
wherein performing the simulation is subsequent to performing the numerical operation on the element matrix for each different timestep.

23. The method as recited in claim 17 further comprising optimizing the element matrix using node tearing techniques.

24. The method as recited in claim 17 further comprising optimizing the element matrix using circuit folding techniques.

* * * * *